United States Patent [19]
Kusaba

[11] Patent Number: 5,936,269
[45] Date of Patent: Aug. 10, 1999

[54] SEMICONDUCTOR MEMORY DEVICE INCLUDING A REDUNDANT CIRCUIT

[75] Inventor: Susumu Kusaba, Tokyo, Japan

[73] Assignee: Oki Electric Industry Co., Ltd., Tokyo, Japan

[21] Appl. No.: 09/150,739

[22] Filed: Sep. 10, 1998

[30] Foreign Application Priority Data

Nov. 20, 1997 [JP] Japan .................................... 9-338016

[51] Int. Cl.[6] .................................................. H01L 27/10
[52] U.S. Cl. .......................... 257/208; 257/203; 365/200; 365/202; 365/225; 365/230.03; 365/230.04
[58] Field of Search .................................. 257/203, 208; 365/200, 202, 230.03, 230.04, 225.7

[56] References Cited

U.S. PATENT DOCUMENTS

| | | | |
|---|---|---|---|
| 5,787,043 | 7/1998 | Akioka et al. | 365/200 |
| 5,793,683 | 8/1998 | Evans | 365/200 |
| 5,841,707 | 11/1998 | McClure | 365/200 |
| 5,841,708 | 11/1998 | Nagata | 365/200 |

FOREIGN PATENT DOCUMENTS 63-292500   11/1988   Japan .

Primary Examiner—Ngân V. Ngô
Attorney, Agent, or Firm—Jones Volentine, LLP

[57] ABSTRACT

An address program circuit 11 provided in a semiconductor memory device receives an internal address signal which corresponds to an address signal, and outputs a signal /RE1 for causing the switching operation from a defective memory cell to a redundant memory cell. One fuse of each pair of fuses F10-1 and F10-2, F11-1 and F11-2, . . . , F1n-1 and F1n-2 in each of selection portions S0, S1, . . . Sn is cut off in response to the address of the defective memory cell, thereby the signal /RE1 being made active upon receipt of a predetermined internal address signal. With this structure, the defective memory cell may be remedied without generating any complementary internal address corresponding to the address signal as inputted externally.

7 Claims, 7 Drawing Sheets

SEMICONDUCTOR MEMORY DEVICE INCLUDING A REDUNDANT CIRCUIT

BACKGROUND OF THE INVENTION

The present invention relates generally to a solid state memory device, and is specially relates, although not restricted, to a semiconductor memory device including a redundant circuit which may operate to switch a normal memory cell to a redundant memory cell within a memory cell array formed of a plurality of normal and redundant memory cells disposed in the form of a matrix.

Along with the restless demand for increase in the memory capacity of the semiconductor memory device such as a random access memory (RAM), it has become a serious problem that some defective memory cells in the memory cell array lowers the throughput of the memory device. In order to overcome this problem, addition of a redundant circuit has been proposed as a countermeasure, in which the memory column or row including the defective memory cells is replaced by the redundant memory column or row, thereby improving the throughput of the memory array. The semiconductor memory device having the redundant circuit like this is disclosed in a Japanese unexamined patent publication No. 63-292500 which is incorporated by reference.

The prior art semiconductor memory device 101 having a redundant circuit will now be described in the following, with reference to FIGS. 6 and 7 of the accompanying drawings. As shown in the figures, the semiconductor memory device 101 is provided with an address buffer circuit 103, a memory cell array 105, a decoder 107, address program circuits 111, 112, 113, and 114, a redundant enable circuit 117, inverters 121, 122, 123, 124, and 127, and a NAND gate 129. The following description will be made with regard to a particular case where the memory cell array 105 of the semiconductor memory device 101 is provided with four redundant memory rows SR1, SR2, SR3, and SR4.

The address buffer circuit 103 has the function of generating a complementary internal address signal (a0, /a0), (a1, /a1), . . . , (an, /an) based on an address signal A0, A1, . . . , An which is externally supplied to the semiconductor memory device 101. Internal address signal a0, a1, . . . , an is inputted to the decoder 107 and address program circuits 111, 112, 113, and 114, respectively. Furthermore, the semiconductor memory device 101 is made up such that the above internal address signal a0, a1, . . . , an and the complementary signal /a0, /a1, . . . , /an thereto are inputted to address program circuits 111, 112, 113, and 114, respectively.

The decoder 107 has the function of outputting a selection signal X for selecting a predetermined normal memory row RRn in the memory cell array 105 based on the above internal address signal a0, a1, . . . , an.

On one hand, output terminals of address program circuits 111, 112, 113, and 114 are connected with input terminals of inverters 121, 122, 123, and 124, and also with four input terminals of the NAND gate 129, respectively.

Furthermore, the semiconductor memory device 101 is made up such that enable signals /EN1, /EN2, /EN3, and /EN4 from the redundant enable circuit 117 are respectively inputted to address program circuits 111, 112, 113, and 114.

The inverter 121 is made up to output a selection signal RE1 for selecting the redundant memory row SR1 in the memory cell array 105 in response to the signal /RE1 from the address program circuit 111. In the same way, inverters 122, 123, and 124 are made up to output selection signals RE2, RE3, and RE4 for selecting the redundant memory rows SR2, SR3, and SR4, respectively.

The output terminal of the NAND gate 129 is connected with the input terminal of the inverter 127 and is made up to output a signal R in response to signals /RE1, /RE2, /RE3, and /RE4 inputted thereto. The inverter 127 is made up to output an enable signal /R to the decoder 107 in response to the signal R inputted thereto from the NAND gate 129.

In the next, the structure of address program circuits 111, 112, 113, and 114 will be described in the following, with reference to FIG. 7. Respective structures and functions of these address program circuits 111, 112, 113, and 114 are almost identical to each other, so that the following description will be made only in terms of the address program circuit 111 as a representative from the remainders.

The address program circuit 111 includes NOR gates G0-1, G0-2, G1-1, G1-2, . . . , Gn-1, and Gn-2, fuses F0-1, F0-2, F1-1, F1-2, . . . , Fn-1, and Fn-2, and a NAND gate 131. A pair of NOR gates G0-1 and G0-2 correspond to complementary internal address signals a0 and /a0 i.e. the address signal A0. In the same way, a pair NOR gates G1-1 and G1-2 correspond to the address signal A1, and a pair of NOR gates Gn-1 and Gn-2 corresponds to the address signal An. Also, a pair of fuses F0-1 and F0-2 correspond to the address signal A0. In the same way, a pair of fuses F1-1 and F1-2 correspond to the address signal A1, and a pair of fuses Fn-1 and Fn-2 corresponds to the address signal An.

The enable signal /EN from the redundant enable circuit 117 is inputted to one input terminal of respective NOR gates G0-1, G0-2, G1-1, G1-2, . . . , Gn-1, and Gn-2. Internal address signals a0, /a0, a1, /a1, . . . , an, and /an are inputted to the other input terminal of respective NOR gates G0-1, G0-2, G1-1, G1-2, . . . , Gn-1, and Gn-2.

Each output terminal of NOR gates G0-1, G0-2, G1-1, G1-2, . . . , Gn-1, and Gn-2 is correspondingly connected with one end of respective fuses F0-1, F0-2, F1-1, F1-2, . . . , Fn-1, and Fn-2.

The other ends of fuses F0-1 and F0-2 are commonly connected with the first input terminal of the NAND gate 131. Furthermore, the other ends of fuses F1-1 and F1-2 are commonly connected with the second input terminal of the NAND gate 131. In the same manner, the other ends of respective fuses F2-1 and F2-2 through Fn-1 and Fn-2, are commonly and correspondingly connected with the third through nth input terminals of the NAND gate 131.

This structure enables the NAND gate 131 to output the signal /RE1 to the downstream inverter 121 as shown in FIG. 6.

Operation of the prior art semiconductor memory device 101 as constructed above, will be described in the next.

Here, the preliminary probe check or the like is carried out over the memory cell array 105 of the semiconductor memory device 101. If one defective memory cell has been detected by this check for instance, the address program circuit 111 is initialized corresponding to the address signal A0, A1, . . . , An of the detected defective memory cell (referred to as 'defective address'0 hereinafter). More specifically, either one of a pair of fuses F0-1 and F0-2, F1-1 and F1-2, . . . , Fn-1 and Fn-2, is selectively cut off by a suitable means such as laser rays, thereby causing the enable signal /EN1 from the redundant enable circuit 117 to enter its ON-state (L-level) and also causing the signal /RE1 from the address program circuit 111 to enter its ON-state (L-level) only when the defective address A0, A1, . . . , An is inputted to the semiconductor memory device 101.

With initialization of the address program circuit 111, if the defective address A0, A1, . . . , An is inputted to the semiconductor memory device 101, the NAND gate 129 receives the L-level signal /RE1 from the address program circuit 111, so that it comes to output a H-level signal R to the inverter 127. As a result of this, the inverter 127 outputs the L-level enable signal /R to the decoder 107, thereby the selection signal X i.e. the output from the decoder 107 for selecting the predetermined normal memory row RRn, coming to enter its OFF state.

On one hand, the inverter 121 outputs the H-level selection signal RE1 upon receipt of the L-level signal /RE1 from the address program circuit 111 and selects the redundant memory row SR1. As explained in the above, the prior art semiconductor memory device 101 is constructed such that when it receives the defective address A0, A1, . . . , An, the redundant memory row SR1 is selected instead of the normal memory row including the defective memory cell. Furthermore, if two or more defective memory cells are detected in the memory cell array 105, redundant memory rows SR2, SR3, and SR4 are selected by means of address program circuit 112, 113, and 114, thus making it possible to execute redundancy remedy of the semiconductor memory device.

As discussed in the above, the prior art semiconductor memory device 101 requires the complementary internal address signal (a0, /a0), (a1, /a1), . . . , (an, /an) corresponding to the address signal A0, A1, . . . , An supplied externally thereto. Consequently, the number of internal address signals generated by the address buffer 103 becomes two times as many as that of the address signals which are inputted externally.

In respect of the semiconductor memory device, especially one having a larger memory capacity, improvement in its throughput is recently becoming a more important issue which manufacturers and users of semiconductor devices are very much interested in. Therefore, redundancy technology increases its importance in connection with remedy of the defective memory cell in the memory cell array.

However, in case of the semiconductor memory device having a memory capacity of mega bits class, more than 30 bits have to be prepared for use in the internal address signal. This would naturally causes increase in the pattern area of the chip, which in turn leads to a problem of increase in the chip size.

SUMMARY OF THE INVENTION

The invention has been made in view of the problem as described in connection with the prior art semiconductor memory device. Accordingly, an object of the invention is to provide a novel and improved semiconductor memory device, in which any defective memory cell in the memory cell array, even if it exists, can be relieved without generating any complementary internal address signal corresponding to the address signal as inputted externally.

According to the invention, in order to solve the problem as mentioned above, there is provided a semiconductor memory device having a redundant circuit which enables switching from the normal memory cell to the redundant memory cell in the memory cell array formed of memory cells arranged in the form of the matrix. The redundant circuit according to the invention is provided with an address program circuit capable of outputting a switching signal for controlling the switching from the normal memory cell to the redundant memory cell upon its receipt of an internal address signal, which corresponds to an address signal externally inputted to the semiconductor memory device, and of which the bit number coincides with that of the externally inputted address signal.

According to the semiconductor memory device as made up like the above, even though some defective memory cells are included among a plurality of normal memory cells forming the memory cell array, the semiconductor memory device can be remedied by the redundant circuit. Moreover, the address program circuit provided in the redundant circuit can output a signal for substituting the redundant memory cell for the defective normal memory cell upon its receipt of an internal address signal, which corresponds to an address signal externally inputted to the semiconductor memory device, and of which the bit number coincides with that of the externally inputted address signal. Consequently, the number of patterns used for the internal address signal can be made a half comparing to that which has been used thus far, and the chip size of the semiconductor memory device can be made compact.

Furthermore, the address program circuit may include a logical circuit and a selection portion, the former receiving the internal address signal and outputting, in response to an enable signal, one signal and the other signal, both of which are in the complementary relation, and the latter being capable of selecting either the above one signal or the above other signal.

With such construction as mentioned above, it becomes possible to select either the above one signal or the above other signal in response to the predetermined internal address signal. Accordingly, if the above one signal or the above other signal is used as the switching signal for switching the normal memory cell to the redundant memory cell, it becomes possible to switch the normal memory cell corresponding to the predetermined address signal to the predetermined redundant memory cell only when receiving the predetermined address signal. Moreover, it is also possible to have the enable signal prohibited the switching operation from the normal memory cell to the redundant memory cell.

The logical circuit can be realized with the minimum circuit scale, if it is made up such that it includes a first gate which receives the internal address signal and the enable signal as well, and outputs the above one signal, and a second gate which receives the above one signal and also the enable signal, and outputs the above other signal. Various gate elements and combination thereof may function as the above first and second gates. Namely, both the first and second gates may be replaced by the NOR gate or the NAND gate. Also, the first gate may be replaced by the transfer gate while the second gate may be replaced by the NOR gate. Furthermore, the first gate may be replaced by the transfer gate while the second gate may be replaced by the NAND gate.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENT

Figure 1:
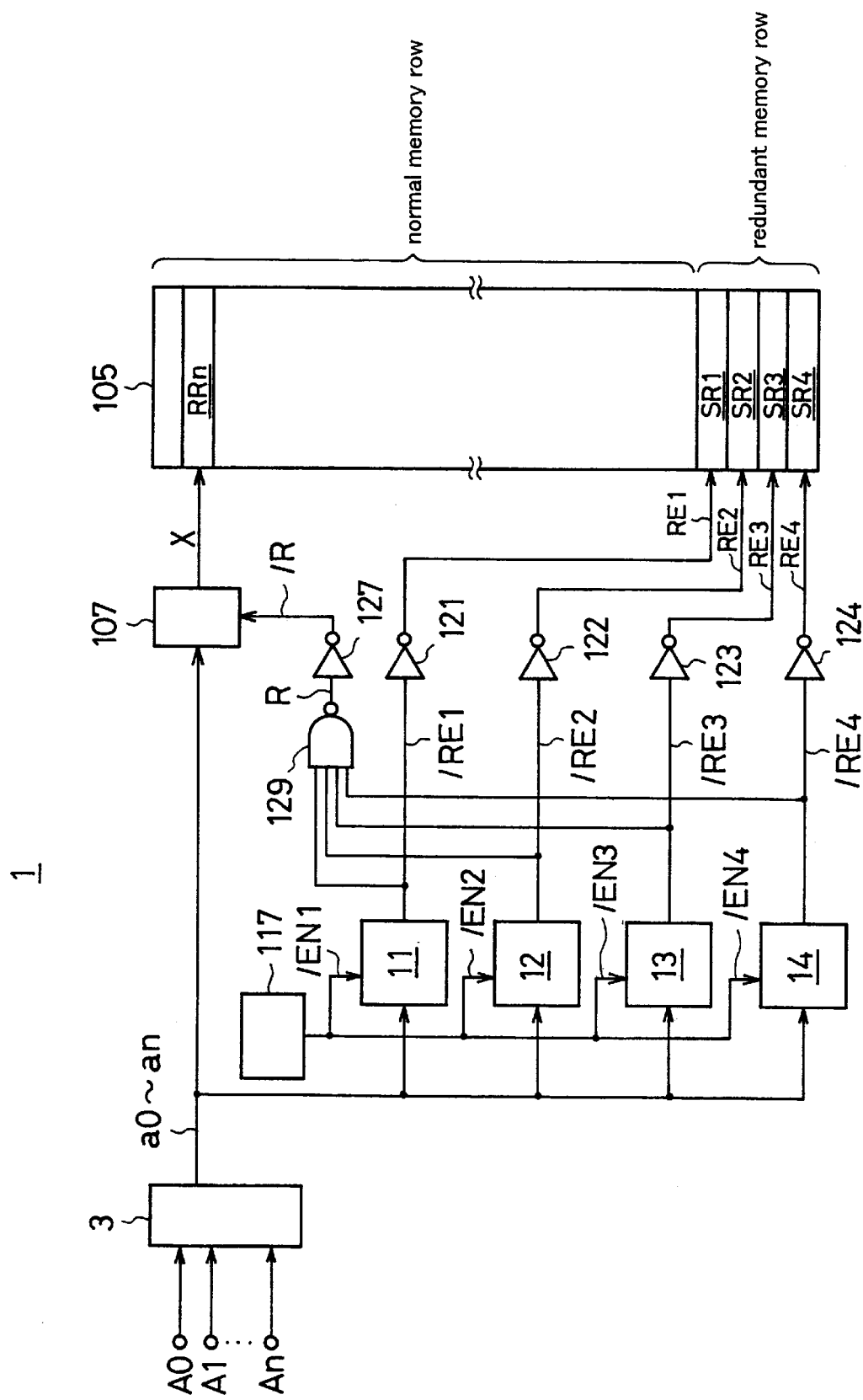
FIG. 1 is a block diagram showing the constitution of a semiconductor memory device according to the first preferred embodiment of the invention.

In the following, the semiconductor memory device according to the invention will now be described in detail in terms of some preferred embodiments according to the invention with reference to the accompanying drawings. In the description in this specification as well as in the accompanying drawings, constituents of the invention which have a substantially identical function and structure, are designated by an identical reference numeral or symbol for avoiding repetitive description thereof.

First Embodiment

Figure 6:
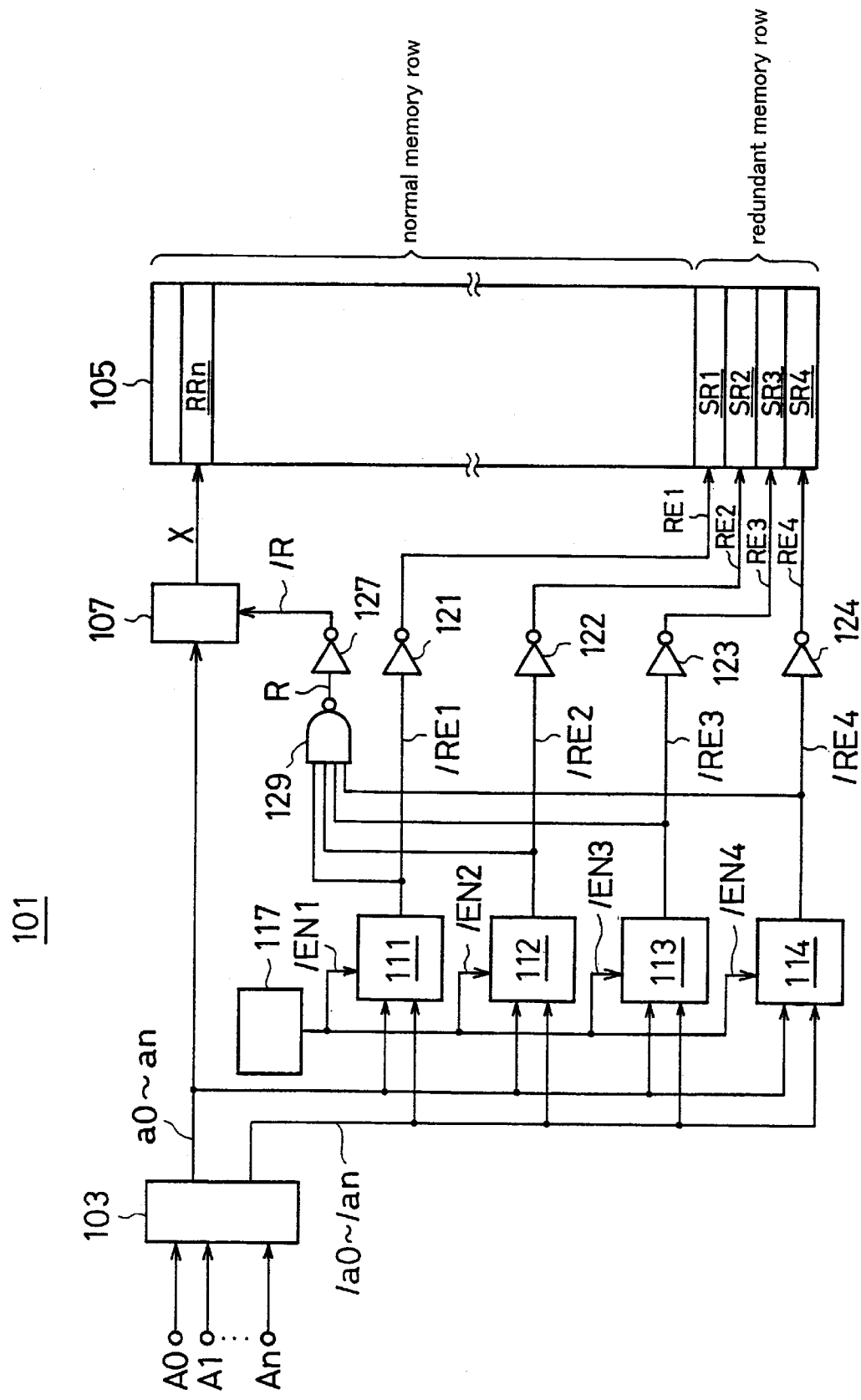
FIG. 6 is a block diagram showing the constitution of a prior art semiconductor memory device.
Figure 7:
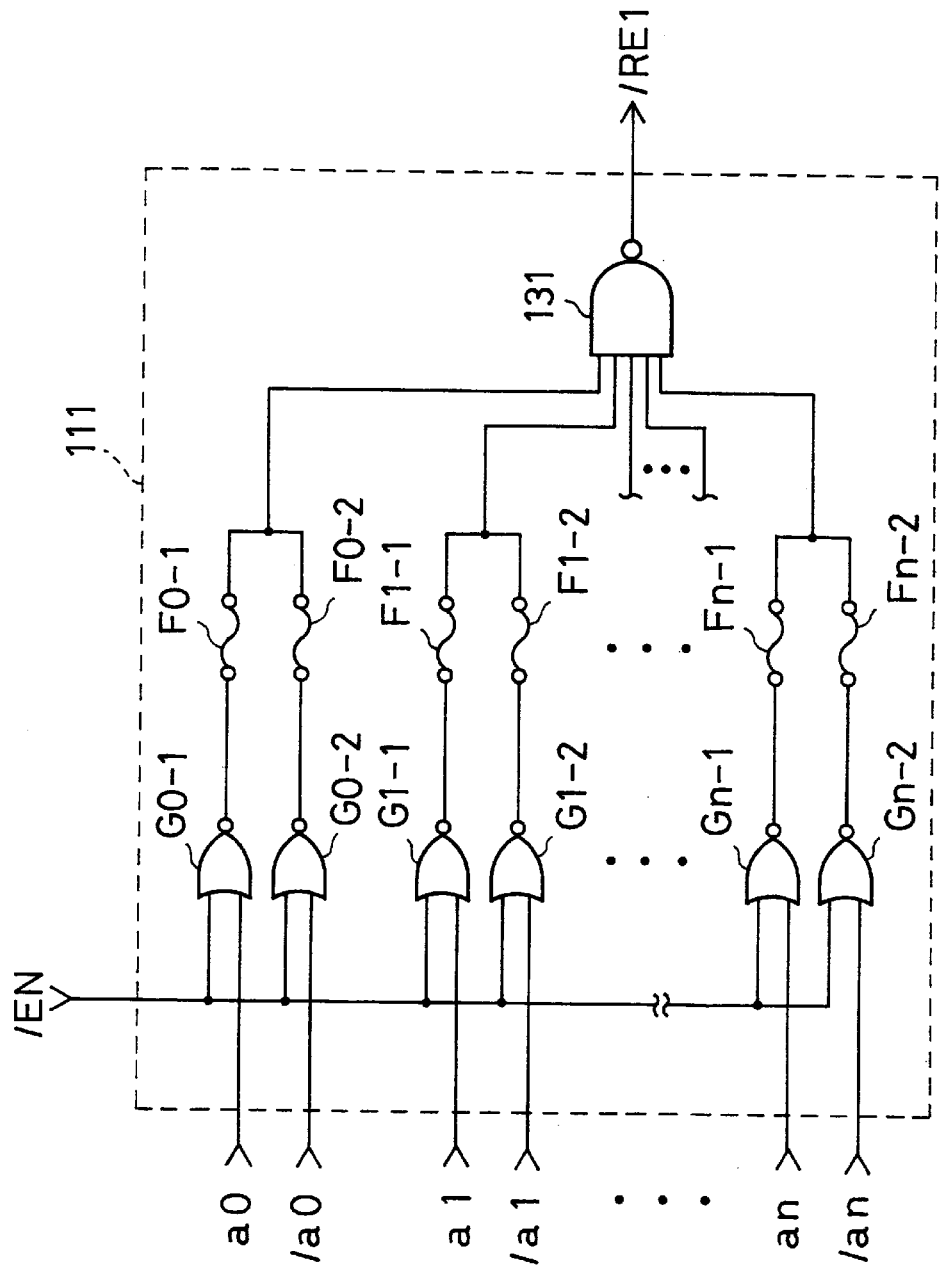
FIG. 7 is a circuit diagram showing the constitution of a address program circuit applicable to the semiconductor memory device shown in FIG. 6.

Referring to FIG. 1, the semiconductor memory device 1 can be achieved by substituting an address buffer circuit 3 and address program circuit 11, 12, 13, and 14 for the address buffer circuit 103 and address program circuits 111, 112, 113, and 114 of the prior art semiconductor memory device 101 shown in FIG. 6, respectively. Namely, the semiconductor memory device 1 includes an address buffer circuit 3, a memory cell array 105, a decoder 107, address program circuits 11, 12, 13, and 14, a redundant enable circuit 117, inverters 121, 122, 123, 124, and 127, and a NAND gate 129. The following description will be made with regard to a particular case wherein the memory cell array 105 of the semiconductor memory device 1 is provided with four redundant memory rows SR1, SR2, SR3, and SR4.

The address buffer circuit 3 operates to generate an internal address signal a0, a1, . . . , an in response to an address signal A0, A1, . . . , An which is externally supplied to the semiconductor memory device 1. In other words, the number of internal address signals outputted from the address buffer circuit 3 of the semiconductor memory device 1 is reduced to a half of that which is outputted by the address buffer circuit 103 of the prior art semiconductor memory device 101. In the following description, it is assumed that the logical level of the internal address signal a0, a1, . . . , an coincides with that of the external address signal A0, A1, . . . , An.

Furthermore, the semiconductor memory device 1 is made up such that the above internal address signal a0, a1, . . . , an is inputted to address program circuits 11, 12, 13, and 14, and the decoder 107 respectively.

The decoder 107 has the function of outputting a selection signal X for selecting a predetermined normal memory row RRn in the memory cell array 105 in response to the internal address signal a0, a1, . . . , an.

On one hand, output terminals of address program circuits 11, 12, 13, and 14 are connected with input terminals of inverters 121, 122, 123, and 124, respectively, and also with four input terminals of the NAND gate 129, respectively.

Furthermore, the semiconductor memory device 1 is made up such that enable signals /EN1, /EN2, /EN3, and /EN4 from the redundant enable circuit 117 are respectively inputted to address program circuits 11, 12, 13, and 14.

The inverter 121 is made up to output a selection signal RE1 for selecting the redundant memory row SR1 in the memory cell array 105 in response to the signal /RE1 from the address program circuit 11. In the same way, inverters 122, 123, and 124 are made up to output selection signals RE2, RE3, and RE4 for selecting the redundant memory rows SR2, SR3, and SR4 in the memory cell array 105, respectively.

The output terminal of the NAND gate 129 is connected with the input terminal of the inverter 127, and outputs a signal R in response to signals /RE1, /RE2, /RE3, and /RE4 inputted thereto. The inverter 127 outputs an enable signal /R to the decoder 107 in response to the signal R inputted thereto from the NAND gate 129.

Figure 2:
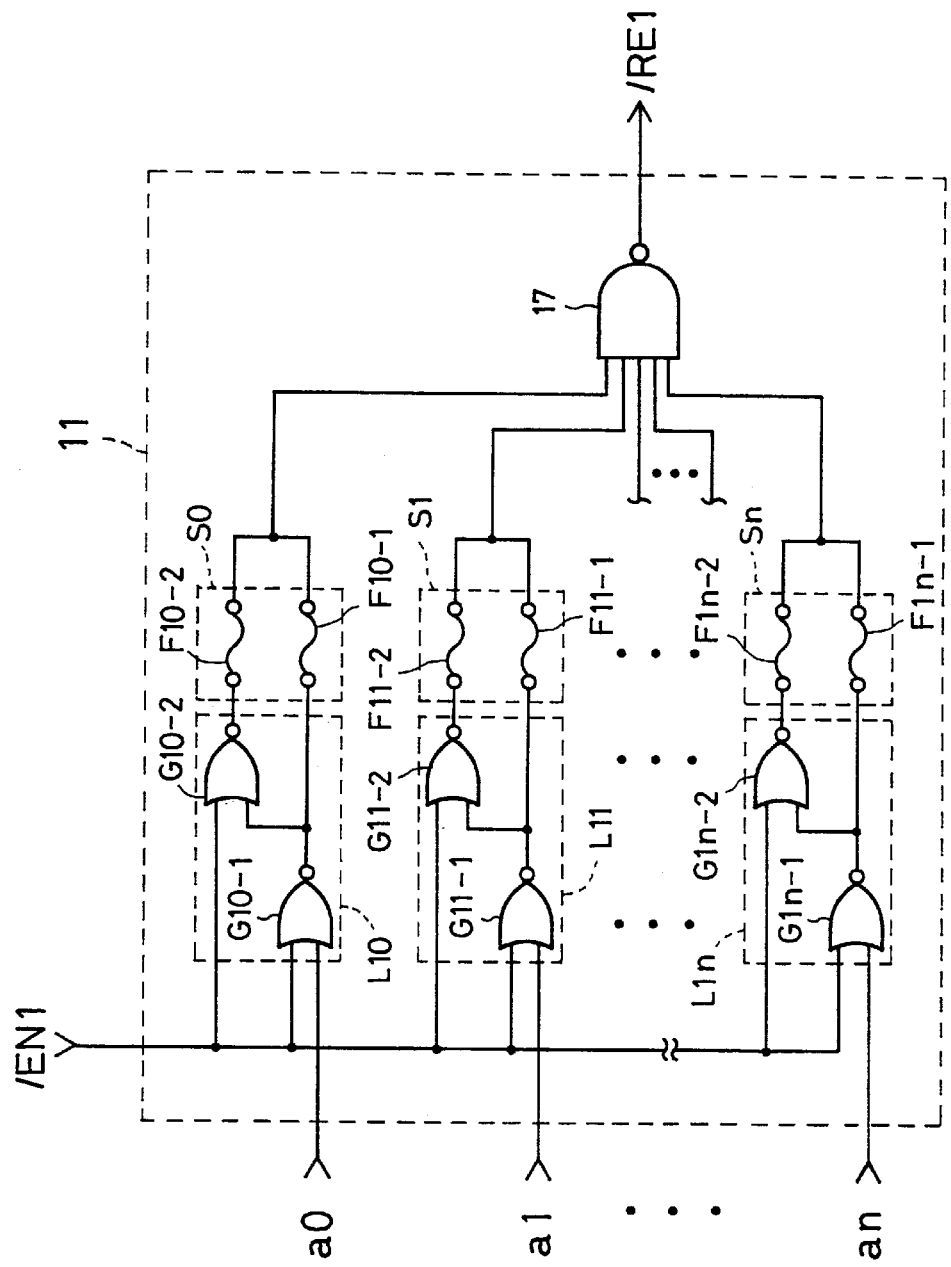
FIG. 2 is a circuit diagram showing the constitution of a address program circuit applicable to the semiconductor memory device shown in FIG. 1.

The structure of address program circuits 11, 12, 13, and 14 will be described in the next with reference to FIG. 2. Respective structures and functions of these address program circuits 11, 12, 13, and 14 are almost identical to each other, so that the following description will be made only in terms of the address program circuit 11 as a representative from the remainders.

The address program circuit 11 incudes logical circuit L10, L11, . . . , L1n, selection portions S0, S1, . . . , Sn, and a NAND gate 17. The logical circuit L10 consists of NOR gates G10-1 and G10-2. In the same way, the logical circuit L11 consists of NOR gates G11-1 and G11-2, . . . , and the logical circuit L1n consists of NOR gates G1n-1 and G1n-2. The selection portion S0 consists of fuses F10-1 and F10-2. In the similar manner, the selection portion S1 consists of fuses F11-1 and F11-2, . . . , and the selection portion Sn consists of fuses F1n-1 and F1n-2.

The enable signal /EN1 from the redundant enable circuit 117 is inputted to one input terminal of respective NOR gates G10-1, G10-2, G11-1, G11-2, . . . , G1n-1, and G1n-2 while internal address signals a0, a1, . . . , an are inputted to the other input terminal of respective NOR gates G10-1, G11-1, . . . , and G1n-1.

The output terminal of the NOR gate G10-1 is connected with one end of the fuse F10-1 and also with the other input terminal of NOR G10-2. In the same manner, the output terminal of the NOR gate G11-1 is connected with one end of the fuse F11-1 and also with the other input terminal of NOR G11-2, . . . , and the output terminal of the NOR gate G1n-1 is connected with one end of the fuse F1n-1 and also with the other input terminal of NOR gate G1n-2.

Each output terminal of NOR gates G10-2, G11-2, . . . , and G1n-2 is correspondingly connected with one end of respective fuses F10-2, F11-2, . . . , and F1n-2.

The other ends of fuses F10-1 and F10-2 are commonly connected with the first input terminal of the NAND gate 17. Furthermore, the other ends of fuses F11-1 and F11-2 are commonly connected with the second input terminal of the NAND gate 17. In the same manner, the other ends of respective fuses F12-1 and F12-2 through Fn-1 and Fn-2, are commonly connected with the third through nth input terminals of the NAND gate 17, respectively.

This structure enables the NAND gate 17 to output the signal /RE1 to the downstream inverter 121 as shown in FIG. 1.

Operation of the semiconductor memory device 1 as made up according to the first embodiment will be described in the following.

First of all, the preliminary probe check or the like is carried out over the memory cell array 105 of the semiconductor memory device 1 in the same way as in the prior art semiconductor memory device 101 as described in the above. Then, if one defective memory cell has been detected for instance, the address program circuit 11 is initialized in response to the address signal A0, A1, . . . , An of the detected defective memory cell (referred to as 'defective address' hereinafter). More specifically, one fuse of each pair of fuses F10-1 and F10-2, F11-1 and F11-2, . . . , F1n-1 and F1n-2, which belong to selection portions S0, S1, . . . , Sn, respectively, is selectively cut off by a suitable means such as laser rays, thereby causing the enable signal /EN1 from the redundant enable circuit 117 to enter its ON-state (L-level) and also causing the signal /RE1 from the address program circuit 11 to enter its ON-state (L-level) only when the defective address A0, A1, . . . , An is inputted to the semiconductor memory device 1. For instance, if the defective address A0, A1, . . . , An is H, L, . . . , L, the corresponding internal address a0, a1, . . . , an is H, L, . . . , L, and the signal /RE1 is caused to enter its ON-state (L-level) by cutting off fuses F10-1, F11-2, . . . , F1n-2.

With this initialization of the address program circuit 11, if the defective address A0, A1, . . . , An is inputted to the semiconductor memory device 1, the NAND gate 129 receives the L-level signal /RE1 from the address program circuit 11, so that it comes to output a H-level signal R to the inverter 127. As a result, the inverter 127 outputs the L-level enable signal /R to the decoder 107, thereby the selection signal X, which is outputted from the decoder 107 to select the predetermined normal memory row RRn, coming to enter its OFF-state.

On one hand, the inverter 121 outputs the H-level selection signal RE1 in response to the L-level signal /RE1 from the address program circuit 11, thereby the redundant memory row SR1 being selected. As explained in the above, the semiconductor memory device 1 according to the first embodiment is made up such that if it receives the predetermined defective address A0, A1, . . . , An, the redundant memory row SR1 is selected instead of the normal memory row including the defective memory cell. Furthermore, this semiconductor memory device 1 not only provides the same function as the prior art semiconductor device 101, but also reduces the pattern area necessary for the internal address a0, a1, . . . , an to a half of that which the prior art semiconductor memory device requires, thus enabling the chip size to be made smaller to a great extent.

Second Embodiment

Figure 3:
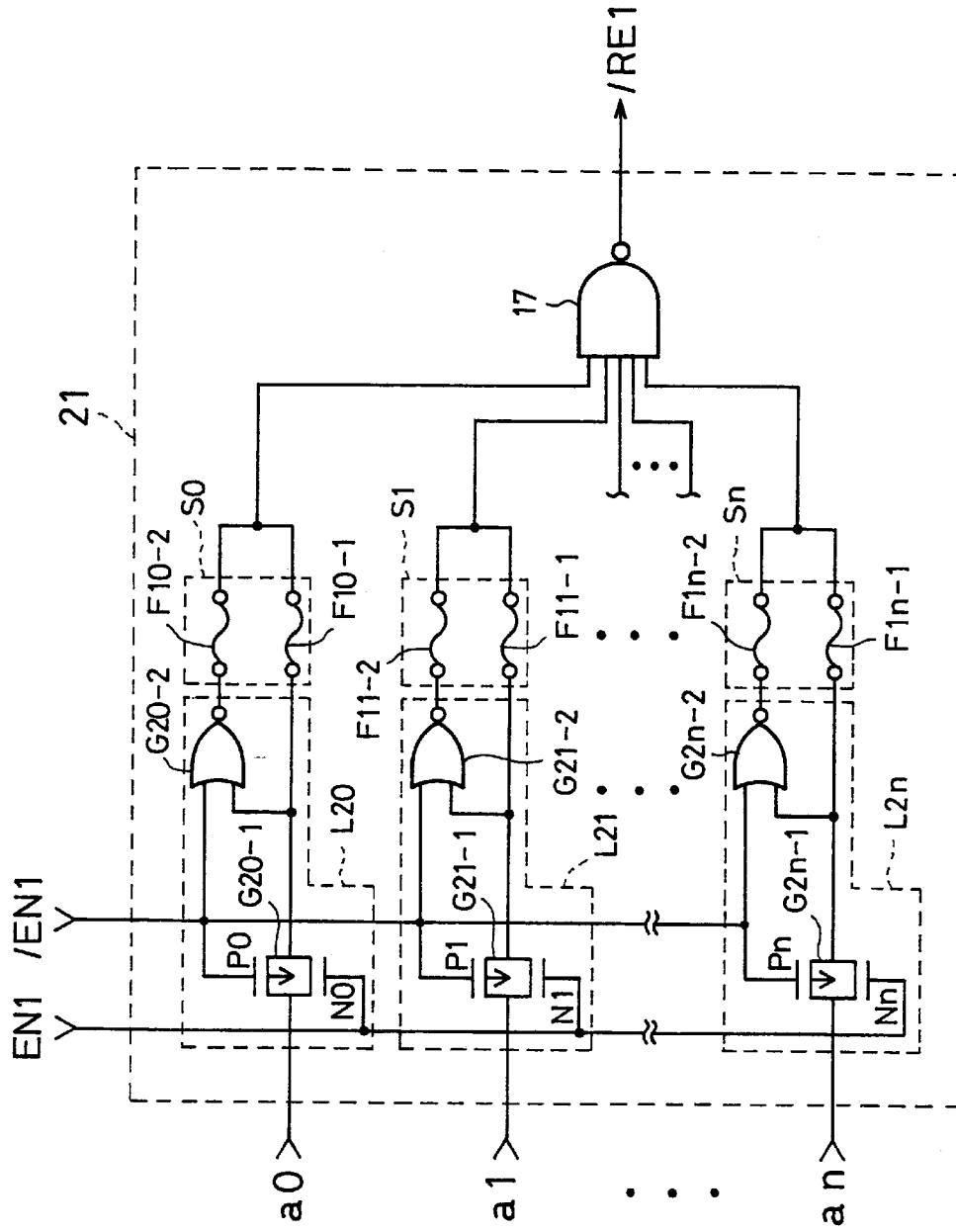
FIG. 3 is a circuit diagram showing the constitution of a address program circuit provided in a semiconductor memory device according to the second embodiment of the invention.

Address program circuits 11, 12, 13, and 14 of the semiconductor memory device 1 according to the first embodiment may be replaced by a address program circuit 21 as shown in FIG. 3. Thus, the semiconductor memory device 1 including the address program circuit 21 will be described as the second embodiment of the invention in the following. The constituents of the semiconductor memory device 1 according to the second embodiment are almost identical to those of semiconductor memory device 1 of the first embodiment except the address program circuit 21, so that the second embodiment will be explained mainly in terms of the address program circuit 21.

The address program circuit 21 is achieved by substituting logical circuits L20, L21, . . . , L2n for logical circuits L10, L11, . . . , L1n of the address program circuit 11. In other words, the address program circuit 21 includes logical circuits L20, L21, . . . , L2n, selection portion S0, S1, . . . , Sn, and a NAND gate 17.

The logical circuit L20 consists of a transfer gate G20-1 and a NOR gate G20-2. In the same way, the logical circuit L21 consists of a transfer gate G21-1 and a NOR gate G21-2, . . . , and the logical circuit L2n consists of a transfer gate G2n-1 and a NOR gate G2n-2. The transfer gate G20-1 is formed by interconnecting the drain and source of a p-channel MOS transistor P0 with those of an n-channel MOS transistor N0. In the same way, The transfer gate G21-1 is formed by interconnecting the drain and source of a p-channel MOS transistor P1 with those of an n-channel MOS transistor N1, . . . , and the transfer gate G2n-1 is formed by interconnecting the drain and source of a p-channel MOS transistor Pn with those of an n-channel MOS transistor Nn.

The Selection portion S0 consists of a pair of fuses F10-1 and F10-2. In the similar manner, the selection portion S1 consists of a pair of fuses F11-1 and F11-2, . . . , and the selection portion Sn consists of a pair of fuses F1n-1 and F1n-2.

The enable signal /EN1 from the redundant enable circuit 117 is inputted to one input of respective NOR gates G20-2, G21-2, . . . , G2n-2, and also to each gate of p-channel MOS transistors P0, P1, . . . , Pn. On the other hand, the enable signal EN1 which is obtained by inverting the logical level of the enable signal /EN1, is inputted to each gate of n-channel MOS transistors N0, N1, . . . , Nn.

Furthermore, the internal address signal a0, a1, . . . , an is inputted to the sources of transfer gates G20-1, G21-1, . . . , G2n-1, respectively.

The drain of the transfer gate G20-1 is connected with one end of the fuse F10-1 and also with the other input terminal of NOR gate G20-2. In the same manner, the drain of the transfer gate G21-1 is connected with one end of the fuse F11-1 and also with the other input terminal of NOR gate G21-2, . . . , and the drain of the transfer gate G2n-1 is connected with one end of the fuse F1n-1 and also with the other input of NOR gate G2n-2.

Furthermore, each output terminal of NOR gates G20-2, G21-2, . . . , and G2n-2 is correspondingly connected with one end of respective fuses F10-2, F11-2, . . . , and F1n-2.

The other ends of a pair of fuses F10-1 and F10-2 are commonly connected with the first input terminal of the NAND gate 17. Furthermore, the other ends of a pair of fuses F11-1 and F11-2 are commonly connected with the second input terminal of the NAND gate 17. In the same manner, the other ends of a pair of fuses F12-1 and F12-2 through F1n-1 and F1n-2, are commonly connected with the third through nth input terminals of the NAND gate 17.

With the structure as described above, the NAND gate 17 comes to output the signal /RE1 to the downstream inverter 121.

Here, the similar initialization carried out over the address program circuit 11 in the first embodiment, is performed over the address program circuit 21 corresponding to the defective address A0, A1, . . . , An. More specifically, one fuse of each pair of fuses F10-1 and F10-2, F11-1 and F11-2, . . . , F1n-1 and F1n-2, which belong to selection portions S0, S1, . . . , Sn, respectively, is selectively cut off by a suitable means such as laser rays, thereby causing the enable signals /EN1 and EN1 from the redundant enable circuit 117 to enter their ON-state (/EN1=L-level, EN1=H-level), and also causing the signal /RE1 from the address program circuit 21 to enter its ON-state (L-level) only when the defective address A0, A1, . . . , An is inputted to the semiconductor memory device 1 according to the second embodiment. For instance, if the defective address signal A0, A1, . . . , An is H, L, . . . , L, the corresponding internal address a0, a1, . . . , an is H, L, . . . , L, and the signal /RE1 is caused to enter its ON-state (L-level) by cutting off fuses F10-2, F11-1, . . . , F1n-1.

With the initialization of the address program circuit 21, if the defective address A0, A1, . . . , An is inputted to the semiconductor memory device 1 according to the second embodiment, the NAND gate 129 receives the L-level signal /RE1 from the address program circuit 21 and comes to output a H-level signal R to the inverter 127. As a result, the inverter 127 outputs the L-level enable signal /R to the decoder 107, thereby the selection signal X, which is outputted from the decoder 107 to select the predetermined normal memory row RRn, being caused to enter its OFF-state.

On one hand, the inverter 121 outputs the H-level selection signal RE1 in response to the L-level signal /RE1 from the address program circuit 21, thereby the redundant memory row SR1 being selected.

As described above, the address program circuit 21 may perform the almost same function as the address program circuit 11 when receiving one enable signal /EN1 and the other enable signal EN1 obtained by inverting the logical level of /EN1 from the redundant enable circuit 117.

In general, two each of a p-channel MOS transistor and an n-channel MOS transistor are required in order to form a NOR gate. Consequently, at least eight MOS transistors are needed for forming each of logical circuits L10, L11, . . . , L1n in the address program circuit 11. In contrast with this, each of logical circuits L20, L21, . . . , L2n in the address program circuit 21 is formed of one transfer gate and one NOR gate, so that the number of MOS transistors as used in each of logical circuits L20, L21, . . . , L2n in the address program circuit 21, is reduced by two each comparing to each of logical circuits L10, L11, . . . , L1n in the address program circuit 11. Accordingly, the semiconductor memory device 1 provided with the address program circuit 21 according to the second embodiment not only performs the almost same function as the semiconductor memory device 1 provided with the address program circuit 11 according to the first embodiment, but also contribute to making the chip size smaller.

Third Embodiment

Figure 4:
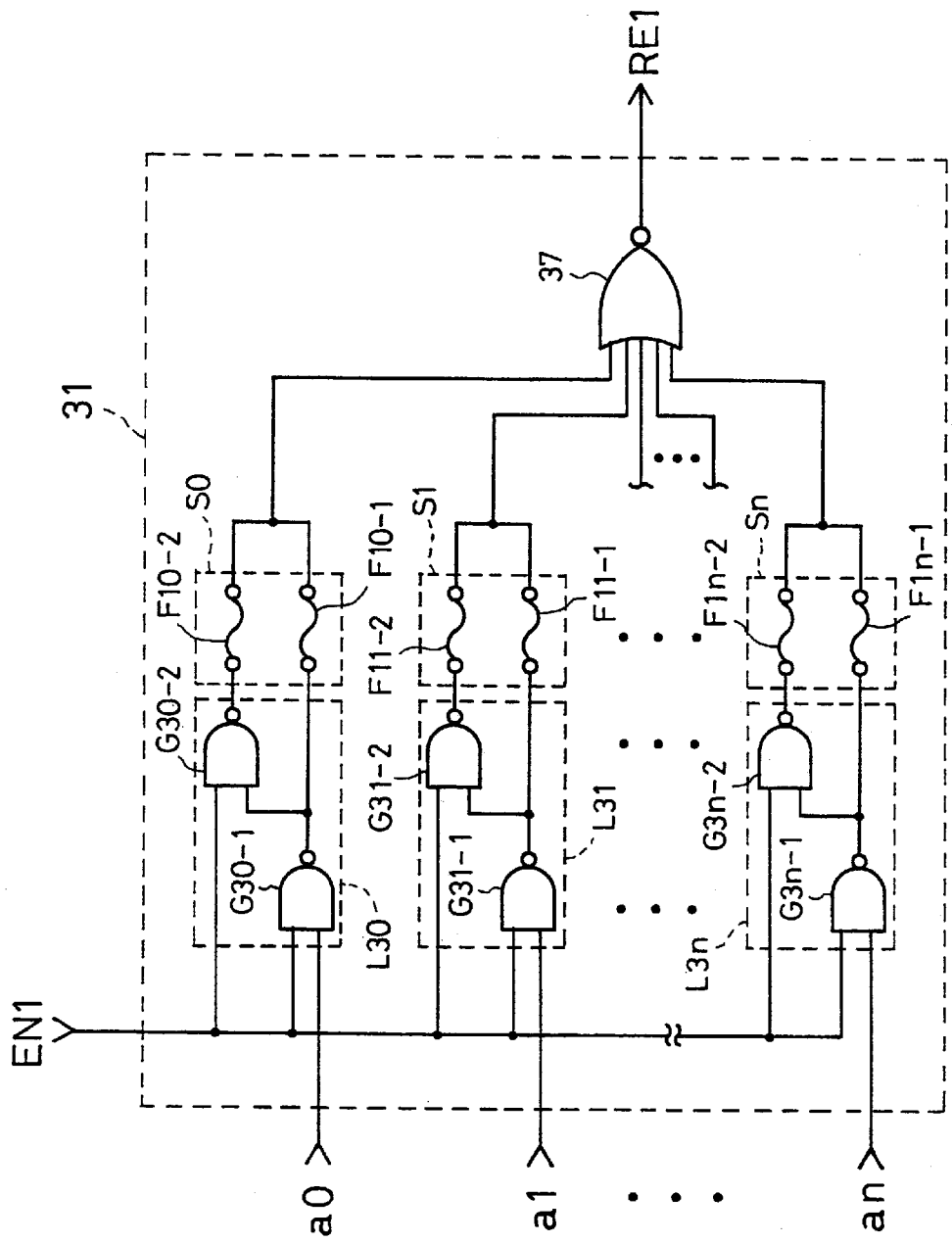
FIG. 4 is a circuit diagram showing the constitution of a address program circuit provided in a semiconductor memory device according to the third embodiment of the invention.

As described in the above, the second embodiment has been explained mainly in terms of the address program circuit 21, which can be substituted for each of the address program circuits 11, 12, 13, and 14 of the semiconductor memory device 1 according to the first embodiment. It is also possible, however, to employ an address program circuit 31 shown in FIG. 4. Therefore, the semiconductor memory device 1 having the address program circuit 31 will be described as the third embodiment of the invention in the following. The constituents of the semiconductor memory device 1 according to the third embodiment are almost identical to those of semiconductor memory device 1 according to the first embodiment except the address program circuit 31, so that the third embodiment will be explained mainly in terms of the address program circuit 31.

The address program circuit 31 is achieved by substituting logical circuits L30, L31, . . . , L3n for logical circuits L10, L11, . . . , L1n of the address program circuit 11, and also substituting the NOR gate 37 for a NAND gate 17. In other words, the address program circuit 31 includes logical circuits L30, L31, . . . , L3n, selection portion S0, S1, . . . , Sn, and the NOR gate 37.

The logical circuit L30 consists of NAND gates G30-1 and G30-2. In the same way, the logical circuit L31 consists of NAND gates G31-1 and G31-2, . . . , and the logical circuit L3n consists of NAND gates G3n-1 and G3n-2.

The Selection portion S0 consists of a pair of fuses F10-1 and F10-2. In the similar manner, the selection portion S1 consists of a pair of fuses F11-1 and F11-2, . . . , and the selection portion Sn consists of a pair of fuses F1n-1 and F1n-2.

The enable signal EN1 from the redundant enable circuit 117 is inputted to one input terminal of respective NAND gates G30-1, G30-2, G31-1, G31-2, . . . , G3n-1, G3n-2. The redundant enable circuit 117 in the first embodiment outputs the enable signal /EN1. However, the enable signal EN1 used in the present embodiment is the inverted logical level signal of the enable signal /EN1. This signal can be generated by a proper circuit such as an inverter circuit.

Furthermore, NAND gates G30-1, G31-1, . . . , G3n-1 are made up to receive the internal address signal a0, a1, . . . , an as inputs thereof, respectively.

The output terminal of the NAND gate G30-1 is connected with one end of the fuse F10-1 and also with the other input terminal of NAND gate G30-2. In the same manner, the output terminal of the NAND gate G31-1 is connected with one end of the fuse F11-1 and also with the other input terminal of the NAND gate G31-2, . . . , and the output terminal of the NAND gate G3n-1 is connected with one end of the fuse F1n-1 and also with the other input terminal of the NAND gate G3n-2.

Furthermore, each output terminal of NAND gates G30-2, G31-2, . . . , and G3n-2 is correspondingly connected with one end of respective fuses F10-2, F11-2, . . . , and F1n-2.

The other ends of a pair of fuses F10-1 and F10-2 are commonly connected with the first input terminal of the NOR gate 37. Furthermore, the other ends of a pair of fuses F11-1 and F11-2 are commonly connected with the second input terminal of the NOR gate 37. In the same manner, the other ends of respective pairs of fuses F12-1 and F12-2 through F1n-1 and F1n-2, are commonly connected with the third through nth input terminal of the NOR gate 37.

With the structure as described above, the NOR gate 37 comes to output the signal RE1. This signal RE1 is an inverted logical level signal which corresponds to the signal /RE1 outputted from the NAND gate 17 in the first embodiment. Therefore, as will be apparent from FIG. 1, if the address program circuit 31 is used, it becomes possible to eliminate the inverter 121 which is disposed downstream the address program circuit 31. In case of using the signal RE1, the NAND gate 129 and the inverter 127 have to be replaced by an NOR gate and so on.

Operation of the semiconductor memory device 1 having the address program circuit 31 according to the third embodiment will be described in the next.

First of all, the similar initialization carried out over the address program circuit 11 in the first embodiment, is performed over the address program circuit 31 in response to the defective address A0, A1, . . . , An. More specifically, one fuse of each pair of fuses F10-1 and F10-2, F11-1 and F11-2, . . . , F1n-1 and F1n-2, which belong to selection portions S0, S1, . . . , Sn, respectively, is selectively cut off by a suitable means such as laser rays, thereby causing the enable signals EN1 from the redundant enable circuit 117 to enter its ON-state (H-level), and also causing the signal RE1 from the address program circuit 31 to enter its ON-state (H-level) only when the defective address A0, A1, . . . , An is inputted to the semiconductor memory device 1. For instance, if the defective address A0, A1, . . . , An is H L, . . . , L, the corresponding internal address signal a0, a1, . . . , an is H L, . . . , L, and the signal RE1 is caused to enter its ON-state (H-level) by cutting off fuses F10-2, F11-1, . . . , F1n-1 of the address program circuit 31.

By performing such initialization of the address program circuit 31, if the defective address A0, A1, . . . , An is inputted to the semiconductor memory device 1 according to the third embodiment, the selection signal X, which is outputted from the decoder 107 to select the predetermined normal memory row RRn, is caused to enter its OFF-state. On one hand, the redundant memory row SR1 is selected by the H-level signal RE1 from the address program circuit 31.

As described in the above, in the semiconductor memory device including the address program circuit 31 according to the third embodiment, the almost same function and effect as provided by the semiconductor memory device 1 according to the first embodiment can be achieved by just taking the logical level matching among signals related mutually.

Fourth Embodiment

Figure 5:
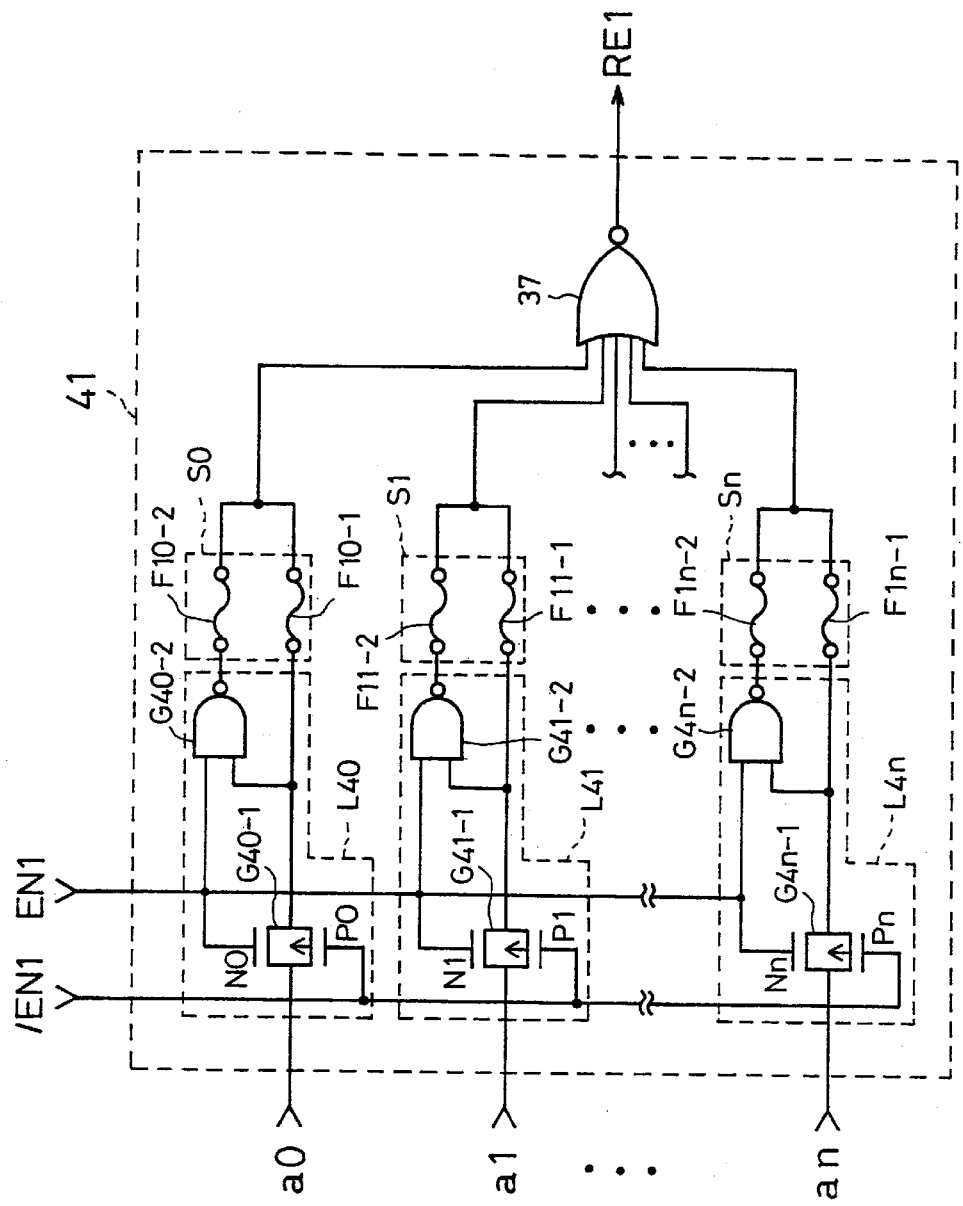
FIG. 5 is a circuit diagram showing the constitution of a address program circuit provided in a semiconductor memory device according to the fourth embodiment of the invention.

Furthermore, an address program circuit 41 shown in FIG. 5 is also applicable to the semiconductor 1 according to the first embodiment in the almost same way as the address program circuit 31. Therefore, the semiconductor memory device including the address program circuit 41 according to the fourth embodiment will be described in detail in the following. Again, the constituents of the semiconductor memory device 1 according to the fourth embodiment are almost identical to those of semiconductor memory device 1 according to the first embodiment except the address program circuit 41, so that the fourth embodiment will be explained mainly in terms of the address program circuit 41.

The address program circuit 41 can be constituted by substituting logical circuits L40, L41, . . . , L4n for logical circuit L30, L31, . . . , L3n of the address program circuit 31 in the third embodiment. Therefore, the address program circuit 41 includes logical circuits L40, L41, . . . , L4n, selection portion S0, S1, . . . , Sn, and a NOR gate 37.

The logical circuit L40 consists of a transfer gate G40-1 and a NAND gate G40-2. In the same way, the logical circuit L41 consists of a transfer gate G41-1 and a NAND gate G41-2, . . . , and the logical circuit L4n consists of a transfer gate G4n-1 and a NAND gate G4n-2. The transfer gate G40-1 is formed by interconnecting the drain and source of a p-channel MOS transistor P0 with those of an n-channel MOS transistor N0. In the same way, the transfer gate G41-1 is formed by interconnecting the drain and source of a p-channel MOS transistor P1 with those of an n-channel MOS transistor N1, . . . , and the transfer gate G4n-1 is formed by interconnecting the drain and source of a p-channel MOS transistor Pn with those of an n-channel MOS transistor Nn.

The Selection portion S0 consists of a pair of fuses F10-1 and F10-2. In the similar manner, the selection portion S1 consists of a pair of fuses F11-1 and F11-2, . . . , and the selection portion Sn consists of a pair of fuses F1n-1 and F1n-2.

The enable signal EN1 which is obtained by inverting the logical level of the enable signal /EN1 from the redundant enable circuit 117, is inputted to one input of respective NAND gates G40-2, G41-2, . . . , G4n-2, and also to each gate of n-channel MOS transistors N0, N1, . . . , Nn. On the other hand, the enable signal /EN1 from the redundant enable circuit 117 is inputted to each gate of p-channel MOS transistors P0, P1, . . . , Pn.

Furthermore, the internal address signal a0, a1, . . . , an is inputted to the sources of transfer gates G40-1, G41-1, . . . , G4n-1, respectively.

The drain of the transfer gate G40-1 is connected with one end of the fuse F10-1 and also with the other input terminal of NAND gate G40-2. In the same manner, the drain of the transfer gate G41-1 is connected with one end of the fuse F11-1 and also with the other input terminal of NAND gate G41-2, . . . , and the drain of the transfer gate G4n-1 is connected with one end of the fuse F1n-1 and also with the other input terminal of NAND gate G4n-2.

Furthermore, each output of NAND gates G40-2, G41-2, . . . , and G4n-2 is correspondingly and respectively connected with one end of respective fuses F10-2, F11-2, . . . , and F1n-2.

The other ends of fuses F10-1 and F10-2 are commonly connected with the first input terminal of the NOR gate 37. Furthermore, the other ends of fuses F11-1 and F11-2 are commonly connected with the second input terminal of the NOR gate 37. In the same manner, the other ends of respective fuses F12-1 and F12-2 through F1n-1 and F1n-2, are commonly connected with the third through nth input terminals of the NOR gate 37.

With the structure as described above, the NOR gate 37 comes to output the signal RE1.

Here, the similar initialization carried out over the address program circuit 31 in the third embodiment, is performed over the address program circuit 41 in response to the defective address A0, A1, . . . , An. More specifically, one fuse of each pair of fuses F10-1 and F10-2, F11-1 and F11-2, . . . , F1n-1 and F1n-2, which belong to selection portions S0, S1, . . . , Sn, respectively, is selectively cut off by a suitable means such as laser rays, thereby causing the enable signals /EN1 and EN1 from the redundant enable circuit 117 to enter their ON-state (/EN1=L-level, EN1=H-level), and also causing the signal RE1 from the address program circuit 41 to enter its ON-state (H-level) only when the defective address A0, A1, . . . , An is inputted to the semiconductor memory device 1 according to the fourth embodiment. For instance, if the defective address A0, A1, . . . , An is H, L, . . . , L, the corresponding internal address signal a0, a1, . . . , an is H L, . . . , L, and the signal RE1 is caused to enter its ON-state (H-level) by cutting off fuses F10-1, F11-2, . . . , F1n-2.

With the initialization of the address program circuit 41, if the defective address A0, A1, . . . , An is inputted to the semiconductor memory device 1 according to the fourth embodiment, the selection signal X, which is outputted from the decoder 107 to select the predetermined normal memory row RRn, is caused to enter its OFF-state. On one hand, the redundant memory row SR1 is selected by the H-level signal RE1 from the address program circuit 41.

As described above, the address program circuit 41 can perform the almost same function as the address program circuit 31 when receiving one enable signal /EN1 and the other enable signal EN1 obtained by inverting the logical level of EN1 from the redundant enable circuit 117.

Moreover, each of logical circuits L40, L41, L4n consists of one transfer gate and one NAND gate. Therefore, the number of MOS transistors as used in each of logical circuits L40, L41, . . . , L4n in the address program circuit 41, is reduced by two each comparing to each of logical circuits L30, L31, . . . , L3n in the address program circuit 31.

Accordingly, the semiconductor memory device 1 provided with the address program circuit 41 according to the fourth embodiment not only performs the almost same function as the semiconductor memory device 1 provided with the address program circuit 31 according to the third embodiment, but also contributes to making the chip more compact.

While the invention has been described by way of example and in terms of several preferred embodiments referring to the accompanying drawings, it is to be understood that the invention is not limited to the embodiments as disclosed herein. To the contrary, it would be apparent to those skilled in the art that they may think of various changes and modifications within the scope of technical thoughts recited in the scope of claim for patent as attached hereto, and that such changes and modifications fall in the technical scope of the present invention.

For instance, the possibility of redundancy remedy in the first embodiment is explained about the case where the memory cell array 105 includes only one defective memory cell. However, redundancy remedy is made possible even in the case where two or more defective memory cells are included therein. In this case, redundant memory rows SR2, SR3, and SR4 are selected by means of address program circuits 112, 113, and 114, thereby executing redundancy remedy.

The above description is made referring to the example wherein the memory cell array 105 includes only four redundant memory rows SR1, SR2, SR3, and SR4. As a matter of course, the invention is not limited to this number of redundant memory rows. The number of redundant memory rows may be increased or decreased depending on the memory capacity of the memory cell array 105. In this case, however, it should be noted that the number of address program circuits has to be increased or decreased so as to accord with the number of redundant memory rows.

The above description is made referring to the example wherein the memory cell array 105 is provided with redundant memory rows. However, the invention may be also applied to the case where the memory cell array 105 is provided with redundant memory columns.

Furthermore, the above description is made referring to the example wherein the logical level of the internal address signal a0, a1, . . . , an coincides with that of the address signal A0, A1, . . . , An. However, the invention is not limited to this, but is applicable to the case wherein the logical level is inverted through the address buffer circuit 3.

Connection and combination between logical gates such as NOR gates, NAND gates, and transfer gates, in the address program circuit are not limited to the above-mentioned. Any arrangement of logical gates may be allowed if the resultant output signal is obtained as designed initially.

In the above embodiments, each selection portion consists of two fuses. However, the fuse is not always an indispensable element. Any element may be used for forming the selection portion if it has the function of selecting one of two signals.

The invention is applicable to not only the semiconductor memory device but also any semiconductor device if it needs redundancy technology.

As has been discussed in the above, according to the invention, even if the memory cell array of the semiconductor memory device includes some defective memory cells, such semiconductor memory device can be remedied without generating any complementary internal address signal against the address signal inputted externally. Accordingly, the internal wiring area which has been reserved for complementary internal address signals, can be made smaller, thus the chip of the semiconductor memory device being made more compact.

The entire disclosure of the Japanese Patent Application No.9-338016 filed on Nov. 20, 1997 including specification, claims, drawings and summary is incorporated herein by reference in its entirety.

What is claimed is:

1. A semiconductor memory device comprising:
   a memory cell array in which memory cells are disposed in the form of the matrix, each of memory cells consisting of a plurality of normal memory cells and redundant memory cells; and
   a redundant circuit which carries out a switching operation from said normal memory cell to said redundant memory cell;
   wherein said redundant circuit is provided with an address program circuit capable of outputting a switching signal for controlling the switching operation from said normal memory cell to said redundant memory cell upon receipt of an internal address signal which corresponds to an address signal externally inputted to said semiconductor memory device, and of which the bit number coincides with that of said externally inputted address signal.

2. A semiconductor memory device as claimed in claim 1, wherein said address program circuit includes;
   a logical circuit which receives said internal address signal and outputs one signal and the other signal which are in the complementary relation in response to an enable signal; and
   a selection portion which can select either said one signal or said other signal.

3. A semiconductor memory device as claimed in claim 2, wherein said logical circuit includes;
   a first gate which receives said internal address signal and said enable signal, and outputs said one signal; and
   a second gate which receives said one signal and said enable signal, and outputs said other signal.

4. A semiconductor memory device as claimed in claim 3, wherein both said first gate and said second gate are a NOR gate.

5. A semiconductor memory device as claimed in claim 3, wherein both said first gate and said second gate are a NAND gate.

6. A semiconductor memory device as claimed in claim 3, wherein said first gate is a transfer gate which is made up with an n-channel MOS transistor and a p-channel MOS transistor, while said second gate is a NOR gate.

7. A semiconductor memory device as claimed in claim 3, wherein said first gate is a transfer gate which is made up with an n-channel MOS transistor and a p-channel MOS transistor, while said second gate is a NAND gate.

* * * * *